United States Patent
Huang

(10) Patent No.: US 11,183,111 B2
(45) Date of Patent: Nov. 23, 2021

(54) PIXEL UNIT AND METHOD FOR MANUFACTURING THE SAME, AND DOUBLE-SIDED OLED DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Xing Huang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/642,193

(22) PCT Filed: Jan. 29, 2019

(86) PCT No.: PCT/CN2019/073579
§ 371 (c)(1),
(2) Date: Feb. 26, 2020

(87) PCT Pub. No.: WO2020/154875
PCT Pub. Date: Aug. 6, 2020

(65) Prior Publication Data
US 2021/0027705 A1    Jan. 28, 2021

(51) Int. Cl.
*G09G 3/3225* (2016.01)
*H01L 27/32* (2006.01)
(Continued)

(52) U.S. Cl.
CPC ..... *G09G 3/3225* (2013.01); *H01L 27/14601* (2013.01); *H01L 27/14605* (2013.01);
(Continued)

(58) Field of Classification Search
CPC .......................... G09G 3/3225; H01L 27/3246
See application file for complete search history.

(56) References Cited

U.S. PATENT DOCUMENTS 10,529,789 B2 * 1/2020 Kim ................... H01L 27/3276
2009/0051285 A1 2/2009 Kajiyama et al.
(Continued)

FOREIGN PATENT DOCUMENTS

| CN | 201540712 U | 8/2010 |
| CN | 102044554 A | 5/2011 |

(Continued)

*Primary Examiner* — Kevin M Nguyen
(74) *Attorney, Agent, or Firm* — The Webb Law Firm

(57) ABSTRACT

The present disclosure provides a pixel unit and a method for manufacturing the same, and a double-sided OLED display device. The pixel unit includes: a substrate; a driving circuit layer including a first and a second driving transistor on one side of the substrate; a first light emitting device including a first anode on one side of the driving circuit layer away from the substrate and connected to a drain of the first driving transistor, a first functional layer on one side of the first anode away from the driving circuit layer, and a cathode on one side of the first functional layer away from the first anode; a second light emitting device including the cathode, a second functional layer, and a second anode on one side of the second functional layer away from the cathode and connected to a drain of the second driving transistor.

20 Claims, 6 Drawing Sheets

(51) Int. Cl.
*H01L 51/52* (2006.01)
*H01L 51/56* (2006.01)
*H01L 27/146* (2006.01)

(52) U.S. Cl.
CPC ...... *H01L 27/3246* (2013.01); *H01L 27/3258* (2013.01); *H01L 27/3262* (2013.01); *H01L 27/3267* (2013.01); *H01L 27/3276* (2013.01); *H01L 51/5209* (2013.01); *H01L 51/5221* (2013.01); *H01L 51/56* (2013.01)

(56) References Cited

U.S. PATENT DOCUMENTS

| | | |
|---|---|---|
| 2011/0241036 A1 | 10/2011 | Yoshinaga et al. |
| 2016/0219673 A1* | 7/2016 | Jaeger ................ H01L 27/3209 |
| 2018/0366527 A1 | 12/2018 | Xu |
| 2019/0006613 A1* | 1/2019 | Bang ................... H01L 27/1248 |

FOREIGN PATENT DOCUMENTS

| | | |
|---|---|---|
| CN | 102077385 A | 5/2011 |
| CN | 202948929 U | 5/2013 |
| CN | 106158913 A | 11/2016 |
| CN | 107104132 A | 8/2017 |
| CN | 108110032 A | 6/2018 |

* cited by examiner

_PIXEL UNIT AND METHOD FOR MANUFACTURING THE SAME, AND DOUBLE-SIDED OLED DISPLAY DEVICE_

CROSS-REFERENCE TO RELATED APPLICATIONS

The present application is a U.S. National Stage Application under 35 U.S.C. § 371 of International Patent Application No. PCT/CN2019/073579, filed on Jan. 29, 2019, the disclosure of which is incorporated by reference herein in its entirety.

TECHNICAL FIELD

The present disclosure relates to the field of display technology, and in particularly, to a pixel unit and a method for manufacturing the same, and a double-sided OLED display device.

BACKGROUND

With the development of display technology, double-sided display has become a new trend. Currently, in the display panel having a double-sided display, two display panels having a single-sided display are attached together.

SUMMARY

According to one aspect of the embodiments of the present disclosure, a pixel unit is provided. The pixel unit comprises: a substrate; a driving circuit layer disposed on one side of the substrate and comprising a first driving transistor and a second driving transistor; a first light emitting device, comprising: a first anode disposed on one side of the driving circuit layer away from the substrate and connected to a drain of the first driving transistor, a first functional layer disposed on one side of the first anode away from the driving circuit layer, and a cathode disposed on one side of the first functional layer away from the first anode; and a second light emitting device, comprising: the cathode, a second functional layer disposed on one side of the cathode away from the first functional layer, and a second anode disposed on one side of the second functional layer away from the cathode and connected to a drain of the second driving transistor.

In some embodiments, the cathode is a reflective cathode.

In some embodiments, the first driving transistor and the second driving transistor are disposed on the substrate spaced apart from each other.

In some embodiments, the driving circuit layer further comprises a cathode trace connected to the cathode; wherein: an orthographic projection of the first light emitting device on the substrate is located between an orthographic projection of the first driving transistor on the substrate and an orthographic projection of the second driving transistor on the substrate, and an orthographic projection of the cathode trace on the substrate is located between the orthographic projection of the first light emitting device on the substrate and the orthographic projection of the second driving transistor on the substrate; or an orthographic projection of the first driving transistor and an orthographic projection of the second driving transistor on the substrate is located on a first side of an orthographic projection of the first light emitting device on the substrate, and an orthographic projection of the cathode trace on the substrate is located on a second side of the orthographic projection of the first light emitting device on the substrate, wherein the second side is opposite to the first side.

In some embodiments, the pixel unit further comprises: a planarization layer disposed between the driving circuit layer and the first light emitting device; and a first connection wire and a second connection wire, wherein the first connection wire, the second connection wire, and the first anode are disposed on the planarization layer spaced apart from each other; and wherein the first anode is connected to the drain of the first driving transistor through a first via that penetrates the planarization layer, the cathode is connected to the cathode trace through the first connection wire and a second via that penetrates the planarization layer, and the second anode is connected to the drain of the second driving transistor through the second connection wire and a third via that penetrates the planarization layer.

In some embodiments, the pixel unit further comprises a first pixel defining layer located on the first anode, the first connection wire, and the second connection wire, wherein the first pixel defining layer defines a first opening and a second opening, the first functional layer is located in the first opening and connected to the first anode, and the cathode is located in the second opening and connected to the first connection wire.

In some embodiments, an orthographic projection of the first pixel defining layer on the substrate covers the orthographic projection of the first driving transistor on the substrate and the orthographic projection of the second driving transistor on the substrate.

In some embodiments, the pixel unit further comprises a second pixel defining layer located on the cathode, wherein the second pixel defining layer defines a third opening, and the second functional layer is located in the third opening and connected to the cathode.

In some embodiments, the first pixel defining layer further defines a fourth opening, the second pixel defining layer further defines a fifth opening, and the second anode is partially located in the fourth opening and the fifth opening and connected to the second connection wire.

In some embodiments, a material of the cathode is selected from one or more of the following: aluminum, and silver.

According to another aspect of the embodiments of the present disclosure, a double-sided OLED display device is provided. The double-sided OLED display device comprises a plurality of pixel units according to any one of the above embodiments.

According to a further aspect of the embodiments of the present disclosure, a method for manufacturing a pixel unit is provided. The method for manufacturing a pixel unit comprises: forming a driving circuit layer on one side of a substrate, wherein the driving circuit layer comprises a first driving transistor and a second driving transistor; and forming a first light emitting device and a second light emitting device on one side of the driving circuit layer away from the substrate, wherein the first light emitting device comprises a first anode connected to a drain of the first driving transistor, a first functional layer on one side of the first anode away from the driving circuit layer, and a cathode on one side of the first functional layer away from the first anode, and the second light emitting device comprises the cathode, a second functional layer on one side of the cathode away from the first functional layer, and a second anode on one side of the second functional layer away from the cathode and connected to a drain of the second driving transistor.

In some embodiments, the step of forming the driving circuit layer on the one side of the substrate comprises:

forming a first active layer for the first driving transistor and a second active layer for the second driving transistor on the one side of the substrate by a same process; forming a gate dielectric layer covering the first active layer and the second active layer; forming a first gate and a second gate on the gate dielectric layer by a same process; forming an interlayer insulating layer covering the first gate and the second gate; and forming a first source, a first drain, a second source, and a second drain each penetrates the interlayer insulating layer and the gate dielectric layer by a same process, wherein the first source and the first drain are connected to the first active layer, and the second source and the second drain are connected to the second active layer.

In some embodiments, the driving circuit layer further comprises a cathode trace on the gate dielectric layer and connected to the cathode, and the interlayer insulating layer further covers the cathode trace, wherein the cathode trace, the first gate and the second gate are formed by a same process.

In some embodiments, the step of forming the first light emitting device and the second light emitting device on the one side of the driving circuit layer away from the substrate comprises: forming a planarization layer defining a first via, a second via, and a third via on the one side of the driving circuit layer away from the substrate; forming a conductive material layer on one side of the planarization layer away from the substrate; patterning the conductive material layer to form a first connection wire, a second connection wire and the first anode, wherein the first anode is connected to the drain of the first driving transistor through the first via, the first connection wire is connected to the cathode trace through the second via, and the second connection wire is connected to the drain of the second drive transistor through the third via; forming a first pixel defining layer, wherein the first pixel defining layer defines a first opening exposing a part of the first anode and a second opening exposing a part of the first connection wire; forming the first functional layer in the first opening; forming the cathode on one side of the first functional layer away from the first anode, wherein the cathode is in contact with the part of the first connection wire exposed; forming a second pixel defining layer, wherein the second pixel defining layer defines a third opening exposing a part of the cathode; forming the second functional layer in the third opening; and forming the second anode on one side of the second functional layer away from the cathode.

In some embodiments, the first pixel defining layer further defines a fourth opening; the second pixel defining layer further defines a fifth opening in communication with the fourth opening, wherein the fourth opening and the fifth opening expose a part of the second connection wire and the second anode is in contact with the part of the second connection wire exposed.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
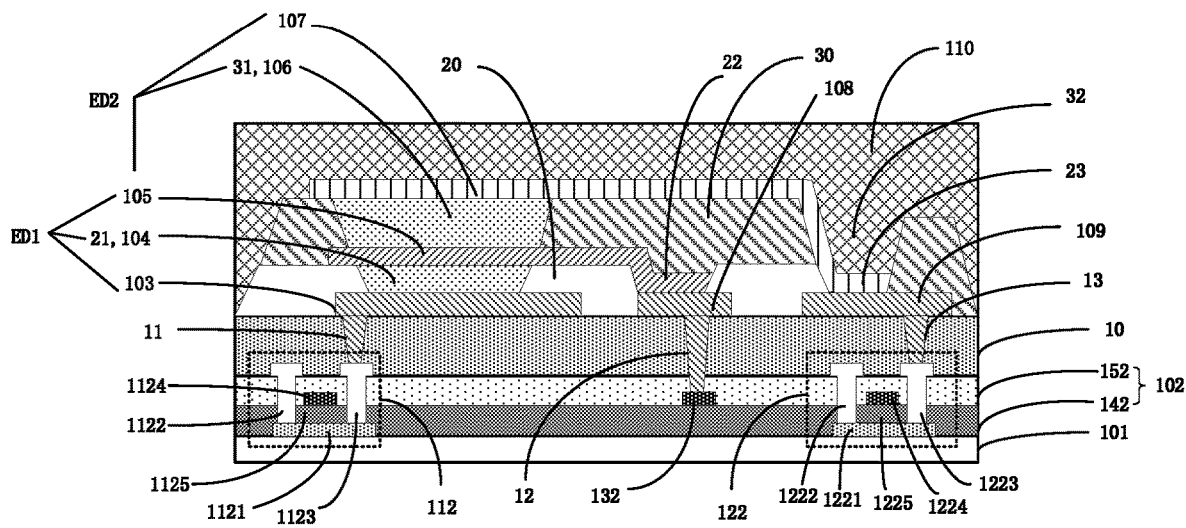
FIG. 1 is a schematic structural view showing a pixel unit according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventor has noticed that since the two single-sided display panels in the double-sided display panel of the related art are each provided with a respective array substrate, the double-sided display panel has a large thickness, and it is unfavorable for light and thin development of the double-sided display panel.

FIG. 1 is a schematic structural view showing a pixel unit according to an embodiment of the present disclosure.

As shown in FIG. 1, the pixel unit comprises a substrate 101, a driving circuit layer 102, a first light emitting device ED1 (at least comprising a first anode 103, a first functional layer 104, and a cathode 105) and a second light emitting device ED2 (at least comprising a cathode 105, a second functional layer 106 and a second anode 107).

The driving circuit layer 102 is disposed on one side of the substrate 101. Here, the driving circuit layer 102 comprises a first driving transistor 112 (e.g., a thin film transistor) configured to drive the first light emitting device and a second driving transistor 122 (e.g., a thin film transistor) configured to drive the second light emitting device. It should be understood that, the driving circuit layer 102 may further at least comprise a switching transistor, a storage capacitor, and the like not shown in FIG. 1. The first driving transistor 112 comprises an active layer 1121, a source 1122, a drain 1123, a gate 1124, and a gate dielectric layer 1125. The second driving transistor 122 comprises an active layer 1221, a source 1222, a drain 1223, a gate 1124 and a gate dielectric layer 1225. The materials of the active layer 1121 and the active layer 1221 may comprise a semiconductor material such as a polysilicon (e.g., a p-type low temperature polysilicon), an oxide semiconductor, and the like. In some embodiments, the driving circuit layer 102 further comprises a cathode trace 132 connected to the cathode 105.

The first anode 103 is disposed on one side of the driving circuit layer 102 away from the substrate 101 and connected to the drain 1123 of the first driving transistor 112. For example, the first anode 103 may be connected to the drain 1123 through a first via 11 penetrating a planarization layer 10. The material of the planarization layer 10 may comprise, for example, a resin material such as polyimide.

The first functional layer 104 is disposed on one side of the first anode 103 away from the driving circuit layer 102. The first functional layer 104 at least comprises a first light emitting layer. The material of the first light emitting layer may comprise, for example, an organic electroluminescent material. In some embodiments, the first functional layer 104 may further comprise at least one of a first hole transport layer or a first electron transport layer. The first hole transport layer is located between the first light emitting layer and the first anode 103, and the first electron transport layer is located between the first light emitting layer and the cathode 105. In some embodiments, the first functional layer 104 may further comprise at least one of a first hole injection layer or a first electron injection layer. The first hole injection layer is located between the first hole transport layer and the first anode 103, and the first electron injection layer is located between the first electron transport layer and the cathode 105.

The cathode 105 is disposed on one side of the first functional layer 104 away from the first anode 103. In some embodiments, the cathode 105 may be connected to the cathode trace 132 in the driving circuit layer 102.

The second functional layer 106 is disposed on one side of the cathode 105 away from the first functional layer 104. The second functional layer 106 at least comprises a second light emitting layer. The material of the second light emitting layer may comprise, for example, an organic electroluminescent material. In some embodiments, the second functional layer 106 may further comprise at least one of a second hole transport layer or a second electron transport layer. The second hole transport layer is located between the second light emitting layer and the second anode 107, and the second electron transport layer is located between the second light emitting layer and the cathode 105. In some embodiments, the second functional layer 106 may further comprise at least one of a second hole injection layer or a second electron injection layer. The second hole injection layer is located between the second hole transport layer and the second anode 107, and the second electron injection layer is located between the second electron transport layer and the cathode 105.

The second anode 107 is disposed on one side of the second functional layer 106 away from the cathode 105 and connected to the drain 1223 of the second driving transistor 122.

In some embodiments, the pixel unit further comprises an encapsulation layer 110 covering the second anode 107. The encapsulation layer 110 may comprise, for example, two inorganic layers and an organic layer located between the two inorganic layers.

It should be understood that the first light emitting device and the second light emitting device share the cathode 105. The first driving transistor 112 is configured to drive the first light emitting device to emit light in a bottom light emission mode, and the second driving transistor 122 is configured to drive the second light emitting device to emit light in a top light emission mode.

In some embodiments, the cathode 105 may be a transparent cathode. In other embodiments, the cathode 105 is a reflective cathode, so that the light emitted by the first functional layer 104 and the light emitted by the second functional layer 106 will not affect each other as much as possible. In other words, the cathode 105 may be configured to reflect at least a part of light emitted from the first functional layer 104 to one side of the cathode 105 facing the substrate 101 and to reflect at least a part of light emitted from the second functional layer 106 to one side of the cathode 105 away from the substrate 101. In this way, in the first light emitting device, light emitted from the first light emitting layer in the first functional layer 104 is reflected by the cathode 105 and then transmitted through the first anode 103 to achieve bottom light emission, that is, light emission from top to bottom. In the second light emitting device, light emitted by the second light emitting layer in the second functional layer 106 is reflected by the cathode 105 and then transmitted through the second anode 107 to achieve top light emission, that is, light emission from bottom to top.

In some embodiments, the cathode 105 may have a high reflectance to visible light, for example, greater than 90%, so that the light emitted by the first functional layer 104 and the light emitted by the second functional layer 106 will less affect each other. As an example, the material of the cathode 105 may be selected from one or more of the following: a metal with a high reflectance such as aluminum or silver, or an alloy comprising at least one of the above metals, and the like. In some embodiments, the first anode 103 and the second anode 107 are transparent anodes. For example, the first anode 103 and the second anode 107 have a high transmittance to visible light, which may be, for example, greater than 90% to transmit visible light.

In the above embodiments, the driving circuit layer comprises a first driving transistor connected to the first anode and a second driving transistor connected to the second anode. The first driving transistor and the second driving transistor are configured to drive different light emitting devices to emit light. In such a pixel unit, a thin film transistor connected to the second anode on one side of the second anode away from the substrate is not needed additionally, and thus the thickness of the pixel is smaller.

In some embodiments, referring to FIG. 1, the first driving transistor 112 and the second driving transistor 122 are disposed on the substrate 101 spaced apart from each other. In some embodiments, various functional layers in the first driving transistor 112 and the second driving transistor 122 may be each formed by a same process which is simpler. For example, the active layer 1121 of the first driving transistor 112 and the active layer 1221 of the second driving transistor 122 are formed by a same process; the gate dielectric layer 1125 of the first driving transistor 112 and the gate dielectric layer 1225 of the second driving transistor 122 are formed by a same process; the source 1123 of the first driving transistor 112, the drain 1124 of the first driving transistor 112, the source 1223 of the second driving transistor 122, and the drain 1224 of the second driving transistor 122 are formed by a same process; and the gate 1124 of the first driving transistor 112 and the gate 1224 of the second driving transistor 122 are formed by a same process. More detail will be described later with the method for manufacturing a pixel unit.

It should be understood that "by a same process" means that a film layer for forming a specific pattern is formed by a same film forming process, and then is patterned by a single patterning process with a same mask. It should be noted that, depending on different specific patterns, a single patterning process may comprise multiple exposure, development, or etching processes. The specific patterns formed may be continuous or discontinuous. These specific patterns might be at different heights or have different thicknesses.

The cathode trace 132 may be disposed at different positions in the driving circuit layer 102, which will be explained in conjunction with different embodiments below.

Figure 4A:
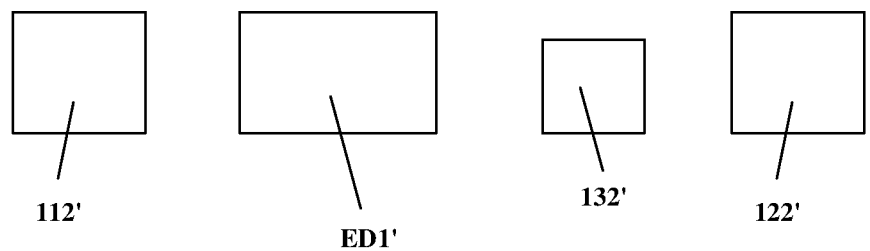
FIGS. 4A-4B are plan views of the orthographic projection of the first light emitting device in some non-limiting embodiments, shown in relation to the orthographic projection of the first driving transistor, the orthographic projection of the second driving transistor, and the orthographic projection of the cathode trace.

In some embodiments, referring to FIG. 4A, an orthographic projection ED1' of the first light emitting device ED1 on the substrate 101 is located between an orthographic projection 112' of the first driving transistor 112 on the substrate 101 and an orthographic projection 122' of the second driving transistor 122 on the substrate 101, and an orthographic projection 132' of the cathode trace 132 on the substrate 101 is located between the orthographic projection ED1' of the first light emitting device ED1 on the substrate 101 and the orthographic projection 122' of the second driving transistor 122 on the substrate 101.

Figure 4B:
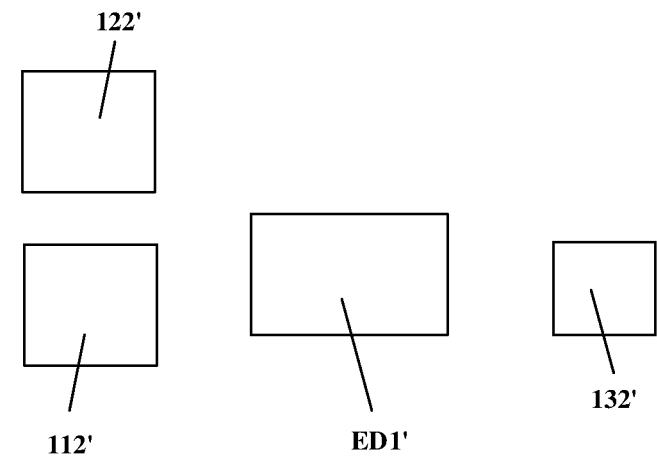

In other embodiments, referring to FIG. 4B, the orthographic projection 112' of the first driving transistor 112 on the substrate 101 and the orthographic projection 122' of the second driving transistor 122 on the substrate 101 is located on the first side of the orthographic projection ED1' of the first light emitting device ED1 on the substrate 101, and the orthographic projection 132' of the cathode trace 132 on the substrate 101 is located on the second side of the orthographic projection ED1' of the first light emitting device ED1 on the substrate 101. Here, the second side is disposed to be opposite to the first side. For example, the orthographic projection 112' of the first driving transistor 112 on the substrate 101 and the orthographic projection 122' of the second driving transistor 122 on the substrate 101 is located on the left side of the orthographic projection ED1' of the first light emitting device ED1 on the substrate 101, while the orthographic projection 132' of the cathode trace 132 on the substrate 101 is located on the right side of the orthographic projection ED1' of the first light emitting device ED1 on the substrate 101. In this manner, the first driving transistor 112 and the second driving transistor 122 are disposed on one same side, and the cathode trace 132 is disposed on the other side, which helps to improve the opening ratio of the pixel unit.

In some embodiments, referring to FIG. 1, the pixel unit may further comprise a planarization layer 10 disposed between the driving circuit layer 102 and the first light emitting device. The pixel unit may further comprise a first connection wire 108 and a second connection wire 109. The first connection wire 108, the second connection wire 109, and the first anode 103 are disposed on the surface of the planarization layer 10 spaced apart from each other. In some implementations, the first anode 103, the first connection wire 108, and the second connection wire 109 may be formed by a same process, that is, formed by patterning the same conductive material layer.

The first anode 103 is connected to the drain 123 of the first driving transistor 112 through a first via 11 penetrating the planarization layer 10. The cathode 104 may be connected to the cathode trace 132 through the first connection wire 108 and a second via 12 penetrating the planarization layer 10. The second anode 107 is connected to the drain 1223 of the second driving transistor 122 through a second connection wire 109 and a third via 13 penetrating the planarization layer 10.

In some implementations, referring to FIG. 1, the pixel unit further comprises a first pixel defining layer 20 on the first anode 103, the first connection wire 108 and the second connection wire 109. The first pixel defining layer 20 defines a first opening 21 and a second opening 22. The first functional layer 104 is connected to the first anode 103 through the first opening 21, and the cathode 105 is connected to the first connection wire 108 through the second opening 22. It should be understood that the first opening 21 exposes a part of the first anode 103, and the second opening 22 exposes a part of the first connection wire 108. In other words, the first pixel defining layer 20 covers a part of the first anode 103 and a part of the first connection wire 108, thereby defining the first opening 21 and the second opening 22. The first functional layer 104 is disposed in the first opening 21, and the cathode 105 is in contact with the exposed part of the first connection wire 108 (that is, the first connection wire 108 at the bottom of the second opening 22).

In some embodiments, the orthographic projection of the first pixel defining layer 20 on the substrate 101 covers the orthographic projection of the first driving transistor 112 on the substrate 101 and the orthographic projection of the second driving transistor 122 on the substrate 101. In other words, the orthographic projection of the first driving transistor 112 on the substrate 101 and the orthographic projection of the second driving transistor 122 on the substrate 101 are within the orthographic projection of the first pixel defining layer 20 on the substrate 101, thus the light emitted by the first light emitting device will not pass through the first driving transistor 112 and the second driving transistor 122, and light exiting efficiency of the pixel unit is improved. It should be understood that although the first driving transistor 112 and the second driving transistor 122 shown in FIG. 1 are located on both sides of the cathode trace 132, this is not restrictive. In some embodiments, the first driving transistor 112 and the second driving transistor 122 may be located on the same side of the cathode trace 132. For example, the first driving transistor 112 and the second driving transistor 122 are located on the left side or the right side of the cathode trace 132. In some embodiments, the first driving transistor 112 and the second driving transistor 122 may be disposed on the same side of the cathode trace 132 and below the first pixel defining layer 20.

In some implementations, referring to FIG. 1, the pixel unit further comprises a second pixel defining layer 30 on the cathode 105. The second pixel defining layer 30 defines a third opening 31, and the second functional layer 106 is connected to the cathode 105 through the third opening 31. It should be understood that, the third opening 31 may expose a part of the cathode 105, and the second functional layer 106 is disposed in the third opening 31 and in contact with the exposed part of the cathode 105.

Next, the specific implementation that the second anode 107 is connected to the drain 1223 of the second driving transistor 122 through the second connection wire 109 will be introduced.

Referring to FIG. 1, in some implementations, the first pixel defining layer 20 may define a fourth opening 23, the second pixel defining layer 30 may define a fifth opening 32, and the second anode 107 is connected to the second connection wire 109 through the fourth opening 23 and the fifth opening 32. In other words, the first pixel defining layer 20 and the second pixel defining layer 30 may expose a part of the second connection wire 109. That is, the first pixel defining layer 20 and the second pixel defining layer 30 cover a part of the second connection wire 109. The second anode 107 is in contact with the exposed part of the second connection wire 109. It should be understood that, here, the exposed part of the second connection wire 109 is the part of the second connection wire 109 that is not covered by the first pixel defining layer 20 and the second pixel defining layer 30. For example, the first pixel defining layer 20 may define a fourth opening 23, and the second pixel defining layer 30 may define a fifth opening 32 in communication with the fourth opening 23. The fourth opening 23 and the fifth opening 32 expose a part of the second connection wire 109.

Figure 2:
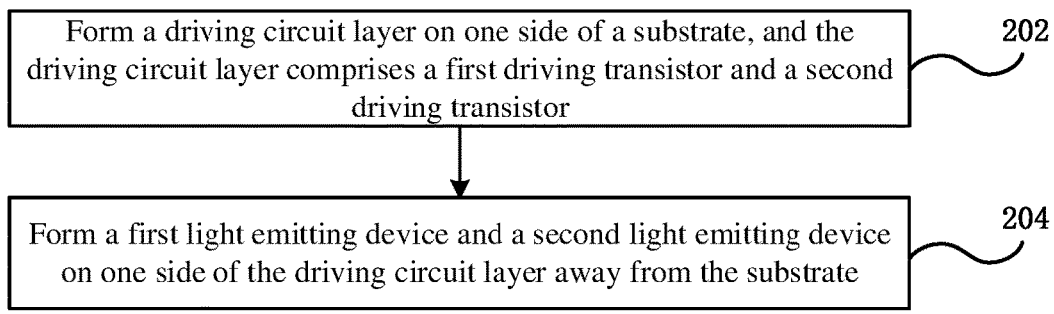
FIG. 2 is a schematic flowchart showing a method for manufacturing a pixel unit according to an embodiment of the present disclosure.

FIG. 2 is a schematic flowchart showing a method for manufacturing a pixel unit according to an embodiment of the present disclosure. FIGS. 3A-3H are schematic cross-sectional views showing structures obtained at different stages of forming a pixel unit according to some embodiments of the present disclosure.

Next, the process of forming a pixel unit according to some embodiments of the present disclosure will be introduced in conjunction with FIG. 2, and FIGS. 3A-3H.

Figure 3A:
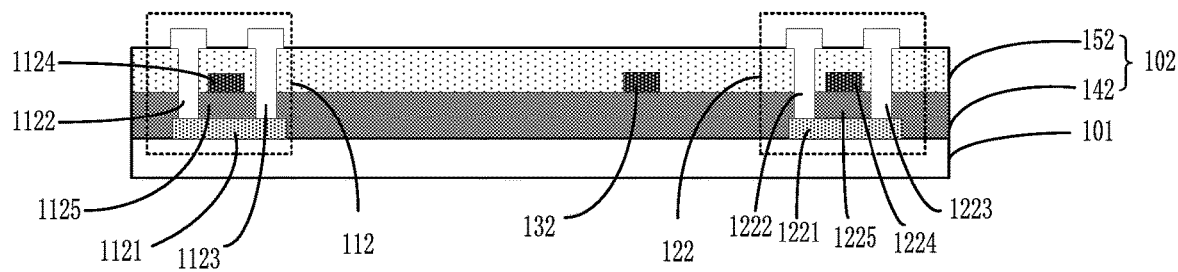
FIGS. 3A-3H are schematic cross-sectional views showing structures obtained at different stages of forming a pixel unit according to some embodiments of the present disclosure.

At step 202, a driving circuit layer 102 is formed on one side of the substrate 101, as shown in FIG. 3A. The driving circuit layer 102 comprises a first driving transistor 112 and a second driving transistor 122.

For example, the first driving transistor 112 and the second driving transistor 122 may be formed in the following manner. First, an active layer 1121 for the first driving transistor 112 and an active layer 1221 for the second driving transistor 122 are formed on the substrate 101 by a same process. Then, a gate dielectric layer 142 covering the active layer 1121 and the active layer 1221 is formed. Here, a part of the gate dielectric layer 142 located on the active layer 1121 may be used as the gate dielectric layer 1125, and a part of the gate dielectric layer 142 located on the active layer 1221 may be used as the gate dielectric layer 1225. Thereafter, a gate electrode 1124 and a gate electrode 1224 are formed on the gate dielectric layer 142. It should be understood that the gate 1124 is located on the gate dielectric layer 1125, and the gate 1224 is located on the gate dielectric layer 1225. Thereafter, an interlayer insulating layer 152 covering the gate 1124 and the gate 1224 is formed. Afterwards, a source 1122, a drain 1123, a source 1222, and a drain 1223 penetrating the interlayer insulating layer 152 and the gate dielectric layer 142 are formed. Here, the source 1122 and the drain 1123 are connected to the active layer 1121, and the source 1222 and the drain 1223 are connected to the active layer 1221.

To distinguish the first driving transistor 112 and the second driving transistor 122, the active layer 1121 may also be referred to as a first active layer, and the active layer 1221 may also be referred to as a second active layer. Similarly, the gate dielectric layer 1125 may also be referred to as a first gate dielectric layer, and the gate dielectric layer 1225 may also be referred to as a second gate dielectric layer. Other members in the first driving transistor 112 and the second driving transistor 122 may also be distinguished in this manner, which will not be described in detail here.

In some embodiments, during the process of forming the first driving transistor 112 and the second driving transistor 122, a cathode trace 132 may also be formed on the gate dielectric layer 142. The cathode trace 132 is connected to a cathode formed subsequently.

For example, the gate 1124 of the first driving transistor 112, the gate 1224 of the second driving transistor 122, and the cathode trace 132 may be formed by a same process. For example, after the gate dielectric layer 142 covering the active layer 1121 and the active layer 1221 is formed, a metal material layer on the gate dielectric layer 142 may be deposited and then patterned to form the gate 1124, the gate 1224 and the cathode trace 132.

It should be understood that, the formed driving circuit layer 102 may further comprise other devices, such as a switching transistor, and the like.

At step 204, a first light emitting device and a second light emitting device are formed on one side of the driving circuit layer 102 away from the substrate 101.

Next, the process of forming the first light emitting device and the second light emitting device will be described in conjunction with FIGS. 3B-3H.

Figure 3B:
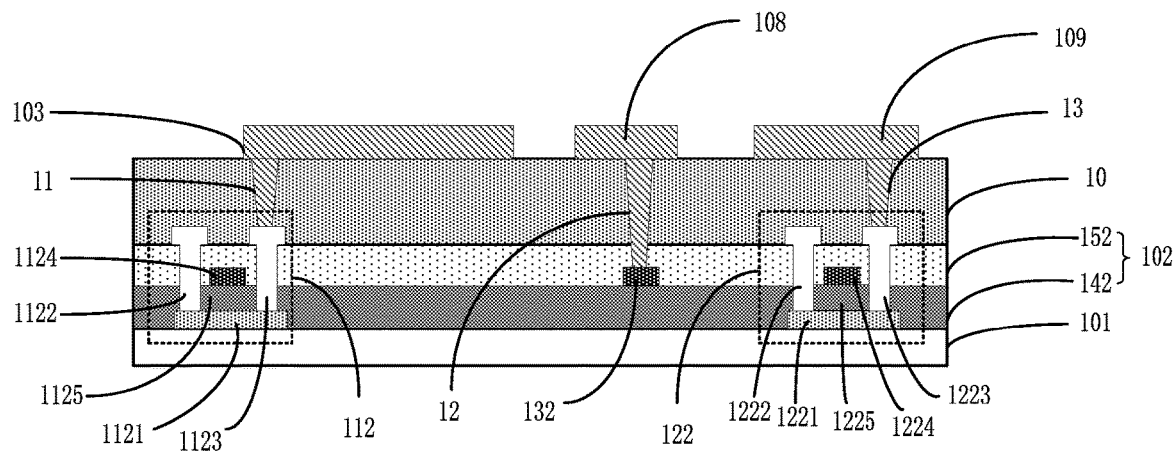

First, as shown in FIG. 3B, a planarization layer 10 defining a first via 11 is formed on one side of the driving circuit layer 102 away from the substrate 101. Then, a conductive material layer is formed on one side of the planarization layer 10 away from the substrate 101. Thereafter, the conductive material layer is patterned to form a first anode 103.

The first anode 103 is connected to the drain 1123 of the first driving transistor 112 through the first via 11. The material of the first anode 103 may comprise, for example, a metal oxide such as indium tin oxide.

In some embodiments, referring to FIG. 3B, the planarization layer 10 further defines a second via 12 and a third via 13. During the process of forming the first anode 103 on one side of the driving circuit layer 102 away from the substrate 101, a first connection wire 108 and a second connection wire 109 may be formed on one side of the driving circuit layer 102 away from the substrate 101. Here, the cathode formed sequentially may be connected to the cathode trace 132 through the first connection wire 108 and the second via 12, and the second anode formed sequentially may be connected to the drain 1223 of the second driving transistor 122 through the second connection wire 109 and the third via 13.

For example, a planarization layer 10 may be first formed on one side of the driving circuit layer 102 away from the substrate 101. Then, the first via 11 connected to the drain 1123, the second via 12 connected to the cathode trace 132, and the third via 13 connected to the drain 1223 are formed. Thereafter, a first connection member located in the first via 11, a second connection member located in the second via 12, and a third connection member located in the third via 13, the first anode 103, the first connection wire 108, and the second connection wire 109 are formed.

In some embodiments, after the first via 11, the second via 12, and the third via 13 are formed, a conductive material layer filling the first via 11, the second via 12, and the third via 13 and covering the planarization layer 10 may be formed. Then, the conductive material layer is patterned to form the first anode 103, the first connection wire 108, and the second connection wire 109. In this case, the first connection member formed in the first via 11 is provided integrally with the first anode 103, the second connection member formed in the second via 12 is provided integrally with the second connection wire 108, and the third connection member formed in the third via 13 is provided integrally with the second connection wire 109.

In other embodiments, a conductive material may be first filled in the first via 11, the second via 12, and the third via 13 by a separate process to form the first connection member, the second connection member, and the third connection member. After the first connection member, the second connection member, and the third connection member are formed, a conductive material is deposited on the planarization layer 10 and then patterned to form the first anode 103, the first connection wire 108 and the second connection wire 109. In this case, the first connection member is not provided integrally with the first anode 103, the second connection member is not provided integrally with the second connecting wire 108, and the third connection member is not provided integrally with the second connecting wire 109.

Figure 3C:
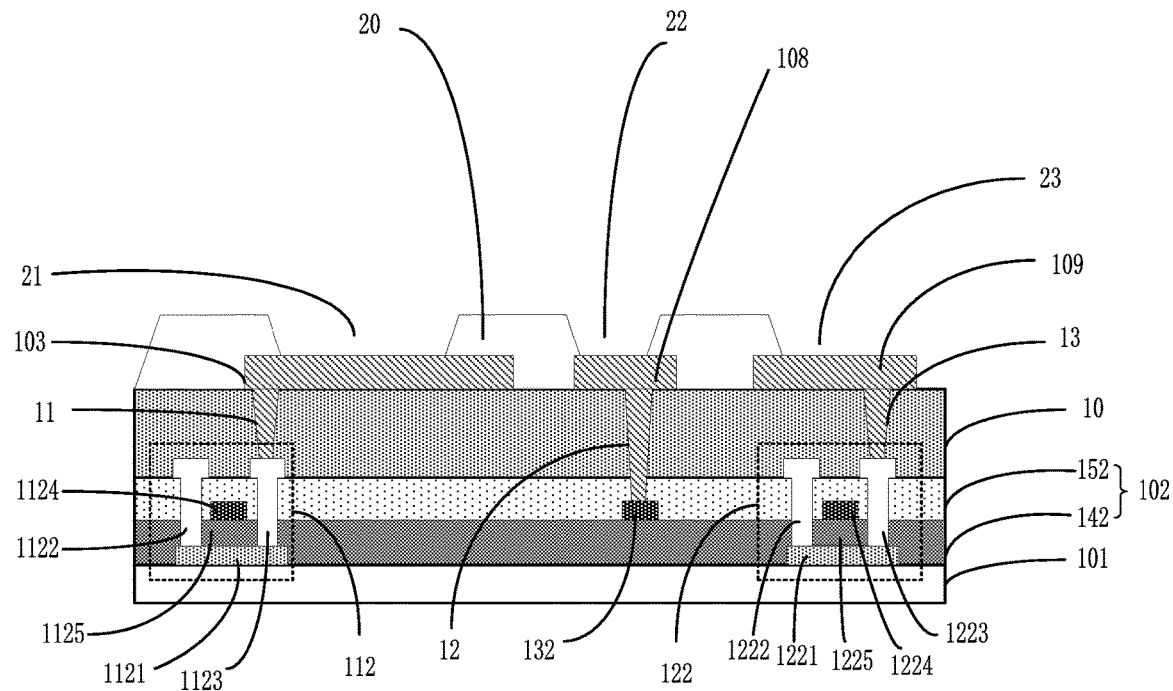

Thereafter, as shown in FIG. 3C, a first pixel defining layer 20 is formed. The first pixel defining layer 20 defines a first opening 21 and a second opening 22. The first opening 21 exposes a part of the first anode 103, and the second opening 22 exposes a part of the first connection wire 108.

Figure 3D:
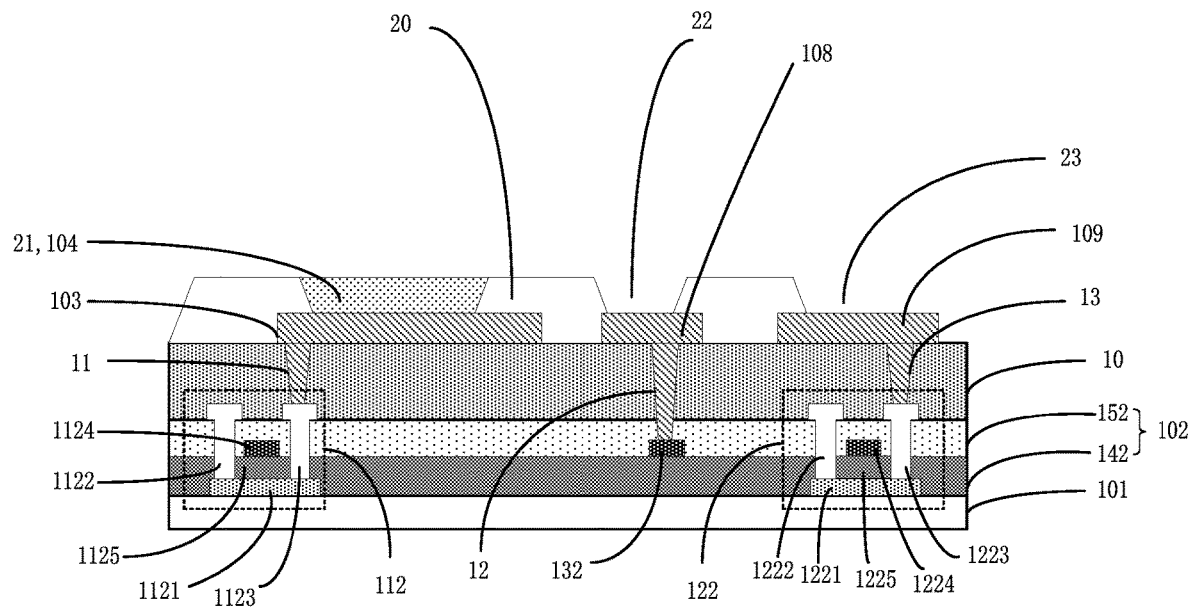

Then, as shown in FIG. 3D, a first functional layer 104 is formed in the first opening 21. For example, the first functional layer 104 may be formed by an inkjet printing process.

Figure 3E:
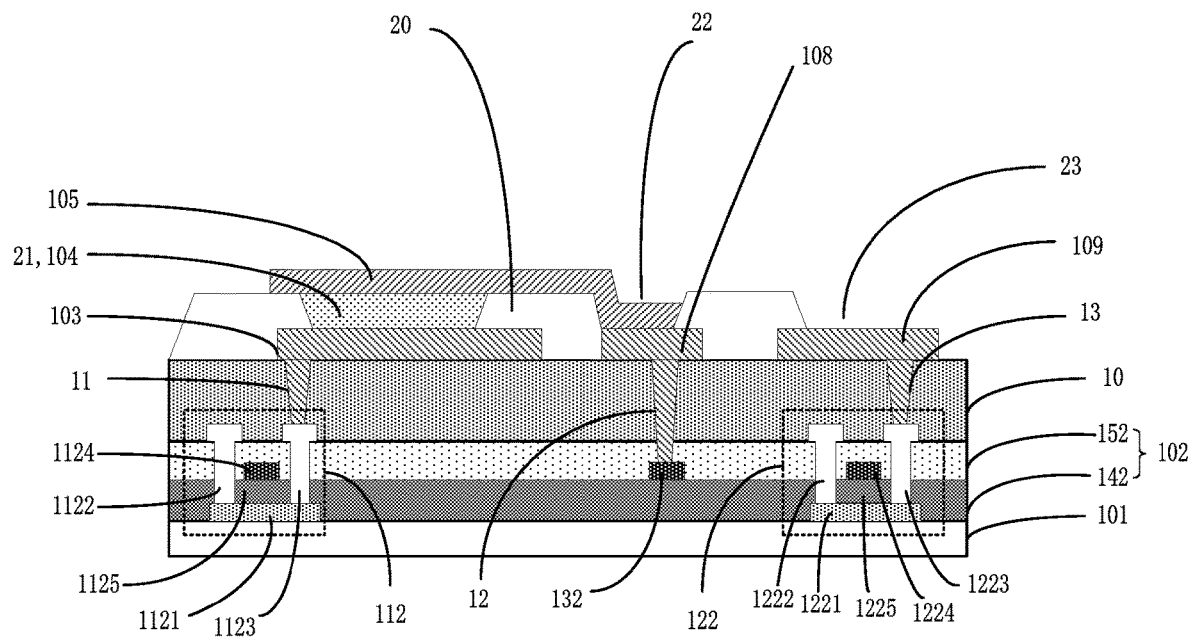

Thereafter, as shown in FIG. 3E, a cathode 105 is formed on one side of the first functional layer 104 away from the first anode 103. Here, the cathode 105 is in contact with the exposed part of the first connection wire 108. In some embodiments, the thickness of the cathode 105 may be, for example, 150 Angstroms to 300 Angstroms, such as 200 Angstroms, 250 Angstroms, or the like. The cathode 105 within such a thickness range may, on one hand, block transmission of the light in a subsequent exposure process (e.g., the exposure process used when the second pixel defining layer 30 is formed) through the cathode 105, thereby avoiding damage caused by the light to the first functional layer 104 below the cathode 105. In addition, the cathode 105 in such a thickness range is not easy to be etched through by a subsequent etching process (e.g., a wet etching process for removing a photoresist used when the second pixel defining layer 30 is formed), thereby avoiding damage caused to the first functional layer 104 below the cathode 105.

For example, after the first functional layer 104 is formed, a cathode material layer may be deposited by a process such as physical vapor deposition. And then, the cathode material layer is etched by a wet etching process or a laser induced etching process to form the cathode 105.

Figure 3F:
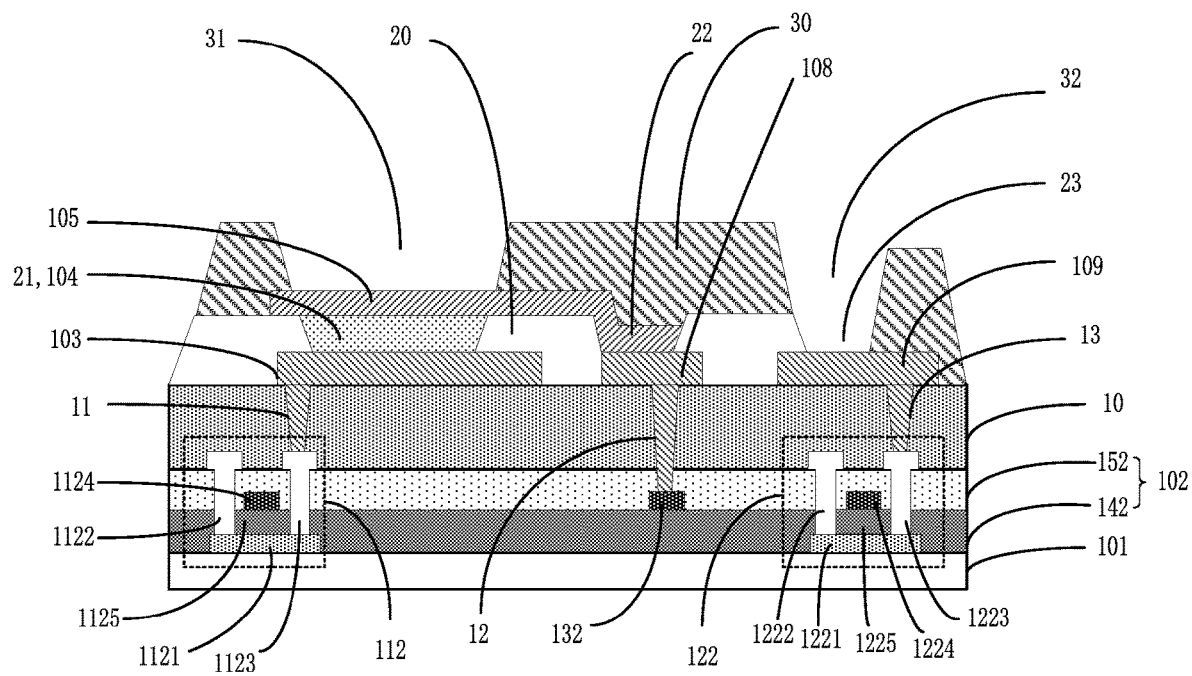

Next, as shown in FIG. 3F, a second pixel defining layer 30 is formed. The second pixel defining layer 30 defines a third opening 31 exposing a part of the cathode 105.

Figure 3G:
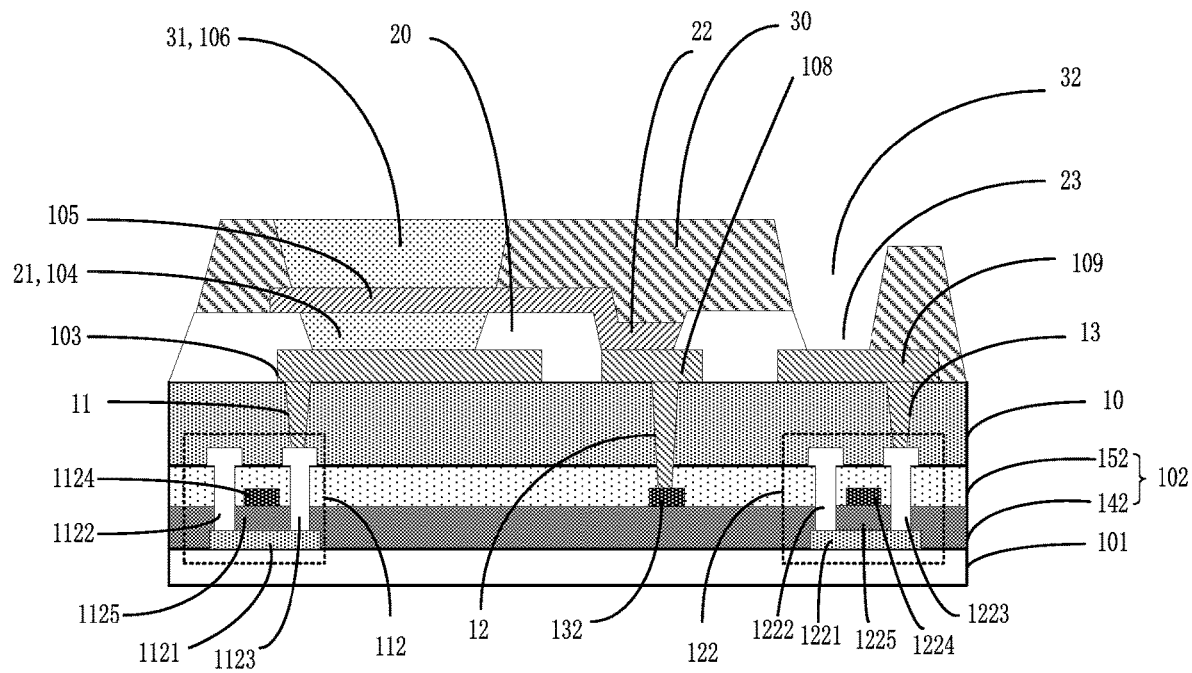

Thereafter, as shown in FIG. 3G, a second functional layer 106 is formed in the third opening 31. For example, the second functional layer 106 may be formed by an inkjet printing process.

Figure 3H:
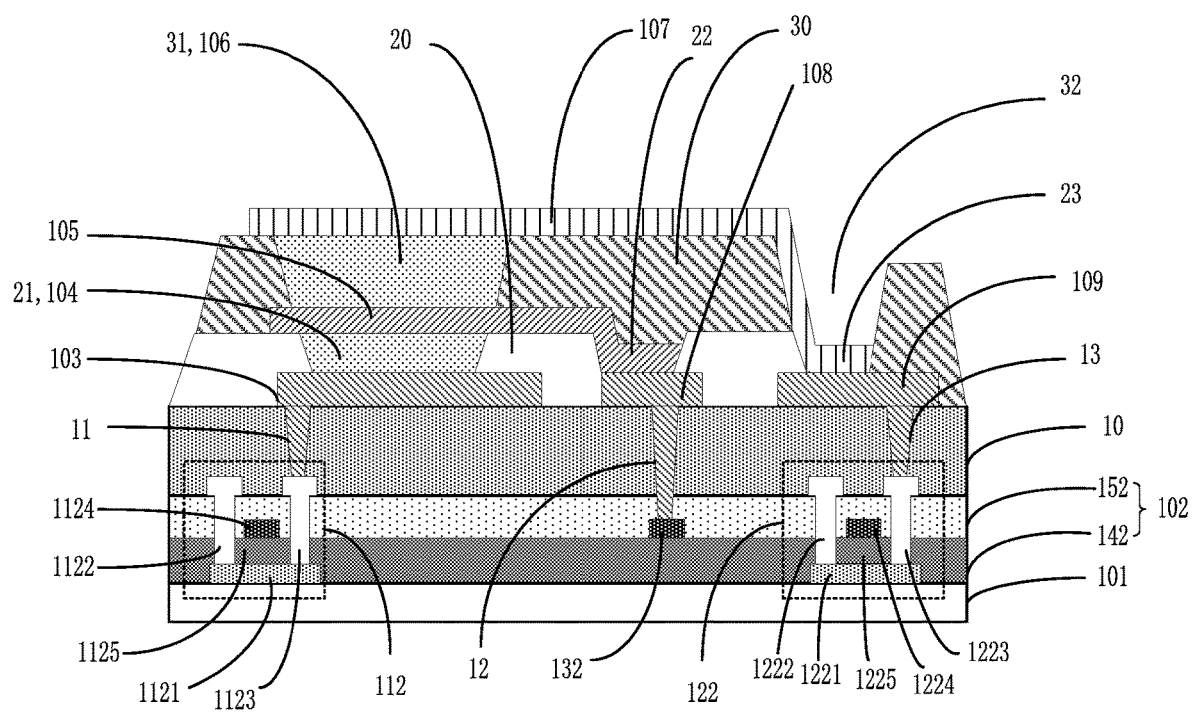

Thereafter, as shown in FIG. 3H, a second anode 107 is formed on one side of the second functional layer 106 away from the cathode 105.

In some embodiments, the material of the second anode 107 may comprise a metal oxide, such as indium tin oxide and the like. In other embodiments, the material of the second anode 107 may comprise a conductive polymer. For example, a conductive polymer may be formed as the second anode 107 by an inkjet printing process. Generally, the temperature for forming a metal oxide is greater than 400° C. The formation of the second anode 107 by an inkjet printing process may avoid damage caused by a high temperature process to the second functional layer 106, without affecting the light emitting efficiency of the second functional layer 106 and the service life of the pixel unit. In addition, in the case where the second functional layer 106 and the second anode 107 are both formed by an inkjet printing process, it is more convenient to implement the process.

In some embodiments, referring to FIG. 3E, the formed first pixel defining layer 20 may further define a fourth opening 23 that exposes a part of the second connection wire 109. In addition, referring to FIG. 3F, the formed second pixel defining layer may further define a fifth opening 32 in communication with the fourth opening 23. The fifth opening 32 and the fourth opening 23 expose a part of the second connection wire 109, and the second anode 107 is in contact with the exposed part of the second connection wire 109. In this case, when the first pixel defining layer 20 and the second pixel defining layer 30 are formed, openings (the fourth opening 23 and fifth opening 32) that expose a part of the second connection wire 109 may be formed respectively.

In other embodiments, the formed first pixel defining layer 20 may not define the fourth opening 23. That is, the first pixel defining layer 20 may completely cover the second connection wire 109. In this case, after the second pixel defining layer 30 is formed, an opening that penetrates the second pixel defining layer 30 and the first pixel defining layer 20 and connected to the second connection wire 109 is formed.

In some embodiments, after the second anode 107 is formed, an encapsulation layer 110 covering the second anode 107 may be further formed, thereby forming the pixel unit shown in FIG. 1. For example, the encapsulation layer 110 may be formed by a process such as plasma chemical vapor deposition. The encapsulation layer 110 may block water vapor or oxygen from entering the first functional layer 104 and the second functional layer 106 to avoid the damage caused to light emitting layers in the first functional layer 104 and the second functional layer 106. It should be understood that the encapsulation layer 110 may also cover a part of the driving circuit layer 102.

The process of forming a pixel unit according to some embodiments of the present disclosure has been introduced above. According to such a manner, a double-sided display panel comprising a plurality of pixel units may be formed by a single process. Two display panels are not needed to be formed separately and then attached together. In addition, there is also no need to form two array substrates, thus the thickness of the display panel is smaller.

The embodiments of the present disclosure also provide a double-sided OLED display device. The double-sided OLED display device may comprise one pixel unit or a plurality of pixel units according to any one of the above embodiments. In some embodiments, the double-sided OLED display device may be, for example, any product or member having a display function such as a display panel, a mobile terminal, a television, a display, a notebook computer, a digital photo frame, a navigator, electronic paper, a virtual reality system, or the like.

In some embodiments, the double-sided OLED display device further comprises an encapsulation layer 110 covering the plurality of pixel units. The plurality of pixel units may comprise, for example, a red pixel unit (R), a green pixel unit (G), and a blue pixel unit (B). Here, the pixel unit may also be referred to as a sub-pixel.

In the case where the double-sided OLED display device is a display panel, the driving circuit layer 102 in the display panel may comprise a first driving transistor 112 and a second driving transistor 122 for each pixel unit. Therefore, there is no need to respectively provide two array substrates for two single-sided display panels. The thickness of the display panel is reduced.

In addition, since the first light emitting device and the second light emitting device in each pixel unit are driven by the first driving transistor 112 and the second driving transistor 122 respectively, the screen of the display panel can be more flexibly controlled. For example, both sides of the display panel may be controlled to display different screens.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A pixel unit, comprising:
   a substrate;
   a driving circuit layer disposed on one side of the substrate and comprising a first driving transistor and a second driving transistor;
   a first light emitting device, comprising:
      a first anode disposed on one side of the driving circuit layer away from the substrate and connected to a drain of the first driving transistor,
      a first functional layer disposed on one side of the first anode away from the driving circuit layer, and
      a cathode disposed on one side of the first functional layer away from the first anode; and
   a second light emitting device, comprising:
      the cathode,
      a second functional layer disposed on one side of the cathode away from the first functional layer, and
      a second anode disposed on one side of the second functional layer away from the cathode and connected to a drain of the second driving transistor.

2. The pixel unit according to claim 1, wherein the cathode is a reflective cathode.

3. The pixel unit according to claim 2, wherein the first driving transistor and the second driving transistor are disposed on the substrate spaced apart from each other.

4. The pixel unit according to claim 2, wherein the driving circuit layer further comprises a cathode trace connected to the cathode; wherein:
   an orthographic projection of the first light emitting device on the substrate is located between an orthographic projection of the first driving transistor on the substrate and an orthographic projection of the second driving transistor on the substrate, and an orthographic projection of the cathode trace on the substrate is located between the orthographic projection of the first light emitting device on the substrate and the orthographic projection of the second driving transistor on the substrate.

5. The pixel unit according to claim 4, further comprising:
   a planarization layer disposed between the driving circuit layer and the first light emitting device; and
   a first connection wire and a second connection wire, wherein the first connection wire, the second connection wire, and the first anode are disposed on the planarization layer spaced apart from each other; and
   wherein the first anode is connected to the drain of the first driving transistor through a first via that penetrates the planarization layer, the cathode is connected to the cathode trace through the first connection wire and a second via that penetrates the planarization layer, and the second anode is connected to the drain of the second driving transistor through the second connection wire and a third via that penetrates the planarization layer.

6. The pixel unit according to claim 5, further comprising a first pixel defining layer located on the first anode, the first connection wire, and the second connection wire; and
   wherein the first pixel defining layer defines a first opening and a second opening, the first functional layer is located in the first opening and connected to the first anode, and the cathode is located in the second opening and connected to the first connection wire.

7. The pixel unit according to claim 6, wherein an orthographic projection of the first pixel defining layer on the substrate covers the orthographic projection of the first driving transistor on the substrate and the orthographic projection of the second driving transistor on the substrate.

8. The pixel unit according to claim 6, further comprising a second pixel defining layer located on the cathode, wherein the second pixel defining layer defines a third opening, and the second functional layer is located in the third opening and connected to the cathode.

9. The pixel unit according to claim 8, wherein the first pixel defining layer further defines a fourth opening, the second pixel defining layer further defines a fifth opening, and the second anode is partially located in the fourth opening and the fifth opening and connected to the second connection wire.

10. The pixel unit according to claim 2, wherein the driving circuit layer further comprises a cathode trace connected to the cathode; wherein:
   an orthographic projection of the first driving transistor and an orthographic projection of the second driving transistor on the substrate is located on a first side of an orthographic projection of the first light emitting device on the substrate, and an orthographic projection of the cathode trace on the substrate is located on a second side of the orthographic projection of the first light emitting device on the substrate, wherein the second side is opposite to the first side.

11. The pixel unit according to claim 10, further comprising:
a planarization layer disposed between the driving circuit layer and the first light emitting device; and
a first connection wire and a second connection wire, wherein the first connection wire, the second connection wire, and the first anode are disposed on the planarization layer spaced apart from each other; and
wherein the first anode is connected to the drain of the first driving transistor through a first via that penetrates the planarization layer, the cathode is connected to the cathode trace through the first connection wire and a second via that penetrates the planarization layer, and the second anode is connected to the drain of the second driving transistor through the second connection wire and a third via that penetrates the planarization layer.

12. The pixel unit according to claim 11, further comprising a first pixel defining layer located on the first anode, the first connection wire, and the second connection wire, wherein the first pixel defining layer defines a first opening and a second opening, the first functional layer is located in the first opening and connected to the first anode, and the cathode is located in the second opening and connected to the first connection wire.

13. The pixel unit according to claim 12, wherein an orthographic projection of the first pixel defining layer on the substrate covers the orthographic projection of the first driving transistor on the substrate and the orthographic projection of the second driving transistor on the substrate.

14. The pixel unit according to claim 1, wherein a material of the cathode is selected from one or more of the following: aluminum, and silver.

15. A double-sided OLED display device, comprising: the pixel unit according to claim 1.

16. A method for manufacturing a pixel unit, comprising:
forming a driving circuit layer on one side of a substrate, wherein the driving circuit layer comprises a first driving transistor and a second driving transistor; and
forming a first light emitting device and a second light emitting device on one side of the driving circuit layer away from the substrate, wherein the first light emitting device comprises a first anode connected to a drain of the first driving transistor, a first functional layer on one side of the first anode away from the driving circuit layer, and a cathode on one side of the first functional layer away from the first anode, and the second light emitting device comprises the cathode, a second functional layer on one side of the cathode away from the first functional layer, and a second anode on one side of the second functional layer away from the cathode and connected to a drain of the second driving transistor.

17. The method according to claim 16, wherein the step of forming the driving circuit layer on the one side of the substrate comprises:
forming a first active layer for the first driving transistor and a second active layer for the second driving transistor on the one side of the substrate by a same process;

forming a gate dielectric layer covering the first active layer and the second active layer;
forming a first gate and a second gate on the gate dielectric layer by a same process;
forming an interlayer insulating layer covering the first gate and the second gate; and
forming a first source, a first drain, a second source, and a second drain each penetrates the interlayer insulating layer and the gate dielectric layer by a same process, wherein the first source and the first drain are connected to the first active layer, and the second source and the second drain are connected to the second active layer.

18. The method according to claim 17, wherein the driving circuit layer further comprises a cathode trace on the gate dielectric layer and connected to the cathode, and the interlayer insulating layer further covers the cathode trace, wherein the cathode trace, the first gate and the second gate are formed by a same process.

19. The method according to claim 18, wherein the step of forming the first light emitting device and the second light emitting device on the one side of the driving circuit layer away from the substrate comprises:
forming a planarization layer defining a first via, a second via, and a third via on the one side of the driving circuit layer away from the substrate;
forming a conductive material layer on one side of the planarization layer away from the substrate;
patterning the conductive material layer to form a first connection wire, a second connection wire and the first anode, wherein the first anode is connected to the drain of the first driving transistor through the first via, the first connection wire is connected to the cathode trace through the second via, and the second connection wire is connected to the drain of the second drive transistor through the third via;
forming a first pixel defining layer, wherein the first pixel defining layer defines a first opening exposing a part of the first anode and a second opening exposing a part of the first connection wire;
forming the first functional layer in the first opening;
forming the cathode on one side of the first functional layer away from the first anode, wherein the cathode is in contact with the part of the first connection wire exposed;
forming a second pixel defining layer, wherein the second pixel defining layer defines a third opening exposing a part of the cathode;
forming the second functional layer in the third opening; and
forming the second anode on one side of the second functional layer away from the cathode.

20. The method according to claim 19, wherein:
the first pixel defining layer further defines a fourth opening; and
the second pixel defining layer further defines a fifth opening in communication with the fourth opening, wherein the fourth opening and the fifth opening expose a part of the second connection wire and the second anode is in contact with the part of the second connection wire exposed.

* * * * *